United States Patent [19]

Seymour

[11] Patent Number: 5,220,209
[45] Date of Patent: Jun. 15, 1993

[54] EDGE RATE CONTROLLED OUTPUT BUFFER CIRCUIT WITH CONTROLLED CHARGE STORAGE

[75] Inventor: Michael J. Seymour, Portland, Me.

[73] Assignee: National Semiconductor Corporation, Santa Clara, Calif.

[21] Appl. No.: 767,103

[22] Filed: Sep. 27, 1991

[51] Int. Cl.$^5$ .................. H03K 17/16; H03K 19/0948
[52] U.S. Cl. ..................................... 307/443; 307/451; 307/473
[58] Field of Search ................ 307/443, 473, 263, 451

[56] References Cited

U.S. PATENT DOCUMENTS

| | | | |
|---|---|---|---|
| 4,609,834 | 9/1986 | Gal | 307/443 |
| 4,628,218 | 12/1986 | Nakaizumi | 307/451 |
| 4,959,562 | 9/1990 | Ootani | 307/443 |
| 4,978,870 | 12/1990 | Chen et al. | 307/451 |
| 5,023,472 | 6/1991 | Hashimoto et al. | 307/443 |
| 5,087,837 | 2/1992 | Cline | 307/263 |

*Primary Examiner*—Edward P. Westin
*Assistant Examiner*—Benjamin D. Driscoll
*Attorney, Agent, or Firm*—Daniel H. Kane; James W. Rose; Richard C. Calderwood

[57] ABSTRACT

An edge controlled output buffer circuit reduces the amplitude of power rail noise while maintaining high switching speed by controlled storage and release of charge at the output using new charge storage and discharge capacitor circuits coupled to the output. An output discharging storage capacitor (C1) is coupled to the high potential power rail ($V_{CC}$). A first passgate circuit PSGT1 is coupled between the charge storage capacitor (C1) and the output ($V_{OUT}$). A first control circuit (CTR1) is coupled to the control node (m2) of the first passgate circuit (PSGT1) for transient turn on of the first passgate circuit (PSGT1) when the output is still at high potential level during transition from high to low potential level at the output. A second passgate circuit (PSGT2) is coupled between the charge storage capacitor (C1) and the low potential power rail (GND). The first control circuit (CTR1) is coupled to the control node (m4) of the second passgate circuit (PSGT2) for turn on of the second passgate circuit when the output is at low potential level following the transition. The charge storage capacitor (C1) performs transient storage of discharge from output load capacitance (CL) to reduce ground bounce during a first phase of the transition. The charged capacitor C1 provides transient sourcing of counteracting current for dissipating ground undershoot energy during a second phase of the transition. Similar measures are provided on the supply side of the output buffer circuit for reducing $V_{CC}$ droop and overshoot without sacrificing switching speed.

26 Claims, 8 Drawing Sheets (PRIOR ART)

EDGE RATE CONTROLLED OUTPUT BUFFER CIRCUIT WITH CONTROLLED CHARGE STORAGE

TECHNICAL FIELD

This invention relates to a new edge controlled output buffer circuit for integrated circuit devices. The invention reduces the amplitude of power rail noise including ground bounce and undershoot on the ground rail side of the output buffer circuit without sacrificing switching speed. Similarly the invention reduces $V_{CC}$ droop and overshoot on the supply rail side of the output buffer circuit while maintaining switching speed. This is accomplished by controlled storage and release of charge at the output using new charge storage and discharge capacitor circuits coupled to the output.

BACKGROUND ART

FIG. 1 illustrates an output buffer circuit 40 for reducing switching induced noise described in the Jeffrey B. Davis U.S. Pat. No. 4,961,010. FIG. 1 corresponds with FIG. 4 of that patent. A relatively large current carrying capacity NMOS transistor element N3 sinks discharge current from the output $V_{OUT}$ to the low potential power rail GND. N3 is the primary pulldown transistor element for establishing a logic low potential level signal at the output. A relatively large current carrying capacity PMOS transistor element P3 sources charging current from the high potential power rail $V_{CC}$ to the output $V_{OUT}$. P3 is the primary pullup transistor element for establishing a logic high potential level signal at the output. In this example, the output buffer 40 is a non-inverting tristate output device and data signals of logic high and low potential levels propagate from the data signal input $V_{IN}$ to the output $V_{OUT}$ after signal propagation delay. The tristate output enable and disable signals are applied at the OE terminal input.

A data signal at the input $V_{IN}$ passes through two inverting current amplification stages 12,14 and then is applied with the same polarity as at the input to NAND gate 15 and NOR gate 16. NAND gate 15 ultimately drives the primary pullup transistor element P3. NOR gate 16 ultimately drives the primary pulldown transistor element N3. The second input to each of the logic gates 15,16 is derived from the $\overline{OE}$ terminal input.

An output enable signal OE is applied with inverted polarity $\overline{OE}$ at the tristate $\overline{OE}$ terminal. This tristate signal passes through first and second inverting current amplification stages 18,20 and is applied at the same polarity as the $\overline{OE}$ signal to the input of NOR gate 16. The tristate signal also passes through first and second inverting stages 18,20 and a third inverter stage 22 before it is applied to the input of NAND gate 15. The tristate signal applied to the input of NAND gate 15 is thus of opposite polarity from the $\overline{OE}$ signal and is in phase with the output enable signal OE.

The logic gate arrangement of the output buffer 40 of FIG. 1 delivers output data signals of logic high and low potential levels at the output $V_{OUT}$ in phase with data signals at the input $V_{IN}$ during bistate operation when the output enable signal OE is high ($\overline{OE}$ low). When the OE signal is low ($\overline{OE}$ high) during the high impedance third state, the output transistor elements including primary pullup transistor element P3 and primary pulldown transistor element N3 are disabled. The tristate mode at output $V_{OUT}$ appears as a high impedance to other output buffers on a common bus.

According to the improvements of U.S. Pat. No. 4,961,010, edge rate control circuits are incorporated in the output buffer circuit 40 for controlling turn on of the output pullup and pulldown transistor elements. A relatively small current carrying capacity PMOS secondary pullup transistor element P1 is coupled in parallel with the primary pullup transistor element P3. A relatively small current carrying capacity NMOS secondary pulldown transistor element N1 is coupled in parallel with the primary pulldown transistor element N3. The ratio of current carrying capacities of the primary to secondary pulldown transistor elements N3/N1 and of the primary to secondary pullup transistor elements P3/P1 is preferably at least 4 to 1 or greater and typically in the range of 4/1 to 7/1. For MOS transistors, the current carrying capacity is a function, among other things, of the channel resistance, and in turn the channel width. By way of example a typical channel width for the primary output transistor elements is in the range of $800\mu$–$1400\mu$ (microns) while the channel width of the secondary output transistor element may be for example $200\mu$.

Resistor RD1 is coupled between the control gate nodes of the secondary and primary pulldown transistor elements. Resistor RD1 provides a time constant delay between early turn on of the secondary pulldown transistor element N1 and later turn on of the primary pulldown transistor element N3. Resistor element RD2 is coupled between the control gate nodes of the secondary and primary pullup transistor elements. Resistor RD2 provides a time constant delay between early turn on of the secondary pullup transistor element P1 and later turn on of the primary pullup transistor element P3. Typical resistor values for RD1 and RD2 are 5K ohms and 1K ohms respectively.

The early turn on of small current carrying capacity secondary pulldown transistor element N1 initiates sinking of current from the output $V_{OUT}$ at only a small current sinking level. The initial sinking current level and the charge acceleration are constrained by the size and internal resistance of the small current carrying capacity transistor element N1. The positive ground rise of potential or ground bounce is proportional to L di/dt, where L is the parasitic inductance LG of the ground lead. This first ground bounce event is constrained to a lower level, typically less than one-half that of the ground bounce peak amplitude for conventional output buffer circuits.

The delay resistor RD1 and the parasitic capacitance of the primary pulldown transistor element N3 form an RC delay network which delays turn on of N3. Upon turn on of the large current carrying capacity primary pulldown transistor element N3, a second positive ground rise of potential occurs. However, the second ground bounce is now limited by the reduction in charge in the output load capacitance and is also reduced to half the conventional ground bounce peak amplitude.

U.S. Pat. No. 4,961,010 provides similar edge rate control measures for reducing noise on the supply rail side of the output buffer circuit. The secondary pullup transistor element P1 initiates a relatively small charging current from the supply rail $V_{CC}$ to the output $V_{OUT}$ before turn on of the relatively large charging current of the primary pullup transistor element P3. As a result, first and second $V_{CC}$ droop spikes are generated and limited to a magnitude typically less than half that of conventional output buffer circuits.

According to typical component values for the circuit of FIG. 1, edge control by sequential turn on of the secondary and then the primary output transistors, with passive delay resistors RD1, RD2, increases signal propagation delay by, for example, 1.5 ns operating into a standard output load capacitance of 50 pf. The additional delay of 1.5 ns increases the typical basic output buffer circuit propagation delay from, for example, 4 ns to 5.5 ns. For rapid turn off of the primary output transistor elements N3, P3 without the edge control and without additional delay during respective opposite transitions at the output, pulldown and pullup delay bypass circuits incorporating bypass transistor elements N2, P2 are provided as shown in FIG. 1.

The delay bypass circuit for turning off the pulldown transistor element N3 is provided by NMOS bypass transistor element N2 and MOS inverter gate 42 coupled between the control nodes of the secondary pulldown transistor element N1 and the primary pulldown transistor element N3. The delay bypass circuit bypasses the delay resistor RD1 for rapid turn off of N3 during transition from low to high potential at the output $V_{OUT}$. Similarly on the supply side, the pullup delay bypass circuit is provided by PMOS bypass transistor element P2 and MOS inverter gate 44 coupled between the control nodes of secondary pullup transistor element P1 and the primary pullup transistor element P3. The supply delay bypass circuit bypasses delay resistor RD2 for rapid turn off of the primary pullup transistor element P3 during transition from high to low potential at the output $V_{OUT}$.

A further development for improved edge rate control of the "graduated turn on" or "bifurcated turn on" type output buffer circuits illustrated in U.S. Pat. No. 4,961,010 is described in the Jeffrey B. Davis U.S. Pat. No. 5,036,222 issued Jul. 30, 1991 for OUTPUT BUFFER CIRCUIT WITH OUTPUT VOLTAGE SENSING FOR REDUCING SWITCHING INDUCED NOISE. An output buffer circuit 40a from U.S. Pat. No. 5,036,222 is shown in FIG. 2. An output voltage sensing pulldown control active switching circuit is coupled in series between the control terminal leads of the secondary and primary pulldown transistor elements N1,N3 instead of the passive delay resistor element RD1 of FIG. 1. The pulldown control active switching circuit is provided by the PMOS switch transistor element P4.

For a transition from high to low potential at the output $V_{OUT}$, a high potential signal appears at the control gate node of secondary pulldown transistor element N1. N1 turns on to initiate the relatively small sinking current to begin discharging the output load capacitance. The control gate node of the output voltage sensing switch transistor element P4 senses and follows the fall in voltage at the output $V_{OUT}$. When the voltage at the output drops by the turn on threshold voltage difference for transistor element P4, pulldown control transistor element P4 switches on, passing the high potential level signal to the gate of primary pulldown transistor element N3. Primary pulldown transistor element N3 conducts, completing discharge of the output load capacitance.

Sinking of current from the output and discharge of the output load capacitance is thus accomplished in two steps. The bifurcated turn on produces two ground bounce events at half the amplitude of conventional ground rise noise spikes. Using the active pulldown control switch transistor element P4 in the circuit of FIG. 2 achieves edge control with greater speed than the passive delay resistor element RD1 of the circuit of FIG. 1.

Similarly, on the power supply side of the output buffer circuit 40a of FIG. 2, an output voltage sensing pullup control active switching circuit is coupled in series between the control nodes of the secondary and primary pullup transistor elements P1,P3. The output voltage sensing pullup control switching circuit is provided by NMOS switch transistor element N4. In the case of a low to high potential transition at the output $V_{OUT}$, a low potential signal arrives at the control gate node of secondary pullup transistor element P1. Transistor element P1 turns on initiating the relatively small sourcing current to begin charging the output load capacitance.

The control gate node of output voltage sensing transistor element N4 is coupled to the output $V_{OUT}$ and senses and follows the rise in voltage at the output. When the voltage rise at the output equals the turn on threshold voltage difference for transistor element N4, N4 switches on passing the low potential signal to the control gate node of primary pullup transistor element P3. Primary pullup transistor element P3 completes charging of output load capacitance with the relatively large sourcing current. The low to high transition at the output is therefore accomplished in two steps with bifurcated turn on of the output pullup transistor elements and with two corresponding $V_{CC}$ droop events with noise peaks half that of conventional circuits. Using the pullup control active switching transistor element N4 in the circuit of FIG. 2 achieves edge control with greater speed than the passive delay resistor element RD2 of the output buffer circuit of FIG. 1.

Other variations of the pulldown and pullup edge control active switching circuits are described in U.S. Pat. No. 5,036,222. For example the output voltage sensing pulldown control active switch transistor element P4 may be coupled in parallel with the pulldown delay resistor element RD1 between the control nodes of the secondary and primary pulldown transistor elements N1, N3. Similarly on the supply side, the output voltage sensing pullup control active switch transistor element N4 may be coupled in parallel with the passive delay resistor element RD2 between the control nodes of the secondary and primary pullup transistor elements P1,P3.

These and other alternative prior art passive and active delay circuit arrangements for edge control of a high to low transition on the ground power rail side such as an edge controlled bifurcated turn on output buffer circuit are summarized generically in the circuit of FIG. 3 by the circuit block designated DELAY1. The intermediate and predriver circuit elements for example of FIGS. 1 and 2 are summarized in the circuit block designated PREDRIVER CIRCUIT. Furthermore, an output LOAD coupled to the output $V_{OUT}$ is represented by the load capacitance CL and load resistance RL.

A further anti-noise circuit feature for reducing ground undershoot in an output buffer circuit is illustrated in FIG. 3. This anti-undershoot circuit of FIG. 3 and variations of the anti-undershoot circuit are described in the Alan C. Rogers U.S. Pat. No. 5,049,763 issued Sep. 17, 1991 for ANTI-NOISE CIRCUITS and the Craig M. Peterson U.S. Pat. application Ser. No.

615,077, filed Nov. 19, 1990 for HIGH SPEED ANTI-UNDERSHOOT AND ANTI-OVERSHOOT CIRCUIT. The various anti-undershoot circuit embodiments incorporate an anti-undershoot circuit transistor element AUCT having the primary current path source and drain nodes coupled in an anti-undershoot circuit between a current source such as power supply $V_{CC}$ and the output ground lead through the output ground parasitic lead inductance LG to the external ground GND. In the example of the circuit of FIG. 3 this coupling of the transistor element AUCT to ground is accomplished through the output $V_{OUT}$ and the primary pulldown transistor element N3.

The AUCT CONTROL CIRCUIT is constructed for establishing transient flow of a sacrificial current through the AUCT primary current path from power supply $V_{CC}$ through the output ground lead inductance LG to external ground GND following transition from high to low potential at the output. The primary pulldown transistor element N3 is then conducting. The AUCT parameters and dimensions including channel width and channel resistance are constructed to provide selected resistance in the primary AUCT current path. The anti-undershoot circuit transistor AUCT therefore dissipates undershoot electrical energy stored in the output ground lead inductance LG. This energy dissipation dampens ground potential undershoot and subsequent ringing in the output ground rail.

U.S. Pat. No. 5,049,763 describes a number of different AUCT CONTROL CIRCUITS. According to one embodiment the AUCT CONTROL CIRCUIT is an undershoot detector circuit which generates a transient ground undershoot signal during the transient occurrence of undershoot of potential in the output ground relative to a quiet ground in excess of a selected threshold level. The ground undershoot signal is coupled to the AUCT control node for causing transient flow of sacrificial current through the channel resistance of the AUCT primary current path upon occurrence of ground undershoot. Electrical energy stored in the output ground lead parasitic inductance LG is therefore dissipated during transient occurrence of ground undershoot.

According to another circuit embodiment of the AUCT CONTROL CIRCUIT, a control path resistor element is coupled in series between the control gate node of the primary pullup transistor element P3 and the control gate node of the AUCT. As result the AUCT operates substantially in parallel with the primary pullup transistor element P3 but with transient delay in turn off of the AUCT caused by the control path resistor. The prolonged conduction by the AUCT follows transition from high to low potential at the output and constitutes the transient sacrificial current flow from power supply $V_{CC}$. In all of the embodiments, additional current is drawn from the power supply $V_{CC}$ for undershoot correction. Operation of the anti-undershoot circuit therefore requires increased power dissipation.

OBJECTS OF THE INVENTION

It is therefore an object of the present invention to provide an improved edge rate controlled output buffer circuit for reducing power rail noise while maintaining switching speed. The invention seeks to temper ground rail bounce and undershoot and supply rail droop and overshoot without sacrificing dynamic switching speed and without further increase in signal propagation delay.

Another object of the invention is to provide new controlled charge storage circuits coupled to the output for controlled storage and release of parasitic charge and parasitic energy in order to minimize circuit noise.

A further object of the invention is to provide counteracting or sacrificial current and counteracting energy for reducing ground rail undershoot without drawing and dissipating additional energy from the power supply. According to the invention this may be achieved using the controlled storage and release of parasitic charges and parasitic energy.

DISCLOSURE OF THE INVENTION

In order to accomplish these results, the invention provides a new method of reducing power rail noise in an edge rate controlled output buffer circuit having an output for delivering low and high potential level output signals by sinking current from the output to a low potential power rail and by sourcing current to the output from a high potential power rail for respectively discharging and charging load capacitance coupled to the output. The invention provides the new method step of transiently storing a fraction of the charge from the discharging output load capacitance in a separate charge storage first capacitor during a transition from high to low potential levels at the output for reducing ground bounce. The invention also contemplates discharging the transiently stored charge from the separate charge storage first capacitor to the low potential power rail upon transition to a low potential level at the output for counteracting ground undershoot.

According to the invention these steps are accomplished by switching on a first electrical path between the output and the charge storage first capacitor during the high to low potential level transition at the output for transiently storing a fraction of the charge existing on the output load capacitance and then switching off the first electrical path. The method is further implemented by switching on a second electrical path between the first capacitor and the low potential power rail upon reaching a low potential level at the output for discharging the transiently stored charge, further counteracting power rail noise on the ground rail side.

For reducing power rail noise on the supply rail side of the output buffer circuit, the invention provides the method step of transiently charging the output load capacitance with a fraction of the charge required for charging the output load capacitance to the desired high potential level. This is accomplished using a separate charge storage second capacitor during a transition from low to high potential level at the output for reducing $V_{CC}$ droop. The invention contemplates the further step of charging the separate charge storage second capacitor from the high potential power rail upon transition to a high potential level at the output for counteracting $V_{CC}$ overshoot.

This is accomplished by switching on a third electrical path between the output and the charge storage second capacitor during the low to high potential level transition at the output for transiently charging the output load capacitance with a fraction of the required charge and then switching off the third electrical path. The invention provides for switching on a fourth electrical path between the charge storage second capacitor and the high potential power rail upon reaching a high potential level at the output for charging the second capacitor.

According to the new circuit of the present invention, a separate output discharging charge storage first capacitor is coupled between the output and a first constant voltage source. A first switch element couples the first capacitor to the output. The first switch element is controlled by a control circuit of the output buffer circuit for switching on an electrical path to the output during a transition from high to low potential level at the output for transient storage of a fraction of the charge from the discharging output load capacitance in the charge storage first capacitor for reducing ground bounce as heretofore described.

A second switch element couples the charge storage first capacitor to the low potential power rail. A first control circuit of the output buffer circuit is coupled to the first and second switch elements. The first control circuit is constructed to control the first and second switch elements according to the method of the invention set forth above for reducing power rail noise on the ground rail side of the output buffer circuit.

For reducing power rail noise on the supply rail side of the output buffer circuit, the circuit incorporates a separate output charging second capacitor coupled between the output and a second constant voltage source. A third switch element couples the second capacitor to the output. The third switch element is controlled by the output buffer circuit for switching on an electrical path to the output for transient charging of the output load capacitance with a fraction of the required charge from the second capacitor for reducing $V_{CC}$ droop.

The circuit for reducing power rail noise incorporates a fourth switch element coupling the output charging second capacitor to the high potential power rail. A second control circuit is coupled to the third and fourth switch elements. The second control circuit is constructed to control the third and fourth switch elements to implement the method of the invention set forth above. In the preferred example, the charge storage first capacitor is coupled between the output and the high potential rail while the output charging second capacitor is coupled between the output and the low potential power rail.

The invention provides an output discharging charge storage capacitor having first and second nodes with a first node coupled to the high potential power rail. A first passgate circuit is coupled between the second node of the output discharging charge storage capacitor and the output. The first passgate circuit has a control node coupled in the output buffer circuit for turn on of the passgate circuit during transition from high to low potential level at the output. A feature of the controlled charge storage circuit according to the invention is that it provides transient storage of discharge from the output load capacitance to reduce ground bounce while maintaining high switching speed. A further advantage is that it subsequently provides transient release of the stored charge, sourcing sacrificial current or counteracting current for dissipating and tempering ground undershoot at the low potential power rail.

In the preferred example, a first control circuit is coupled to the control node of the first passgate circuit. The first control circuit is coupled to the data signal input and output of the output buffer circuit for controlling the conducting state of the first passgate circuit according to the data signals at the input and output.

The first control circuit is constructed for transient turn on of the first passgate circuit when the output is still at high potential level during transition from high to low potential level at the output. The control circuit assures that the second node of the output discharging charge storage capacitor is initially at ground or low potential for receiving and storing charge from the output load capacitance.

The invention also provides a second passgate circuit coupled between the second node of the output discharging charge storage capacitor and the low potential power rail. A control node of the second passgate circuit is coupled to the first control circuit for controlling the conducting state of the second passgate circuit according to the data signal at the output. The first control circuit is constructed for turn on of the second passgate circuit when the output is at low potential level upon transition to low potential level at the output. The second passgate circuit provides the counteracting current path for discharging the charge storage capacitor and dissipating ground undershoot energy.

According to a preferred example the first control circuit includes a NOR gate having a first input coupled to the output buffer circuit data signal input. A second input is coupled to the output buffer circuit output through a first inverter gate. The output of the NOR gate is coupled to the control node of the first passgate circuit. A second inverter gate is coupled between the output buffer circuit output and a control node of the second passgate circuit. As a result, the first and second passgate circuits are controlled in a two phase sequence. In the first phase, the output discharging charge storage capacitor provides transient storage of discharge from the output to reduce ground bounce while the first passgate circuit is conducting. In the second phase, the charge storage capacitor discharges and sources counteracting current for dissipating ground undershoot energy when the second passgate circuit is conducting. The control circuit interposes a slight delay between the first and second phases.

Similar circuit arrangements are provided on the supply side of the output buffer circuit for reducing $V_{CC}$ droop and overshoot while maintaining high speed switching. An output charging storage capacitor having third and fourth nodes is provided with the third node coupled to the low potential power rail. A third passgate circuit is coupled between the fourth node of the output charge storage capacitor and the output. A control node of the third passgate circuit is coupled to the output buffer circuit for turn on of the third passgate circuit during transition from low to high potential level at the output. The fourth node of the output charging capacitor is initially at high potential. The charging storage capacitor sources a transient charging current through the third passgate to the output to reduce $V_{CC}$ droop. The charging storage capacitor subsequently provides transient charge storage through a fourth passgate for counteracting $V_{CC}$ overshoot in the high potential power rail. Comparable circuits are provided on the supply side of the output buffer circuit for a second control circuit coupled to the control nodes of the third and fourth passgates for controlling transient sourcing of charging current from the charging storage capacitor and subsequent storage of overshoot energy for tempering power rail noise on the supply side.

Other objects, features and advantages of the invention are apparent in the following specification and accompanying drawings.

DESCRIPTION OF PREFERRED EXAMPLE EMBODIMENTS AND BEST MODE OF THE INVENTION

Figure 1:
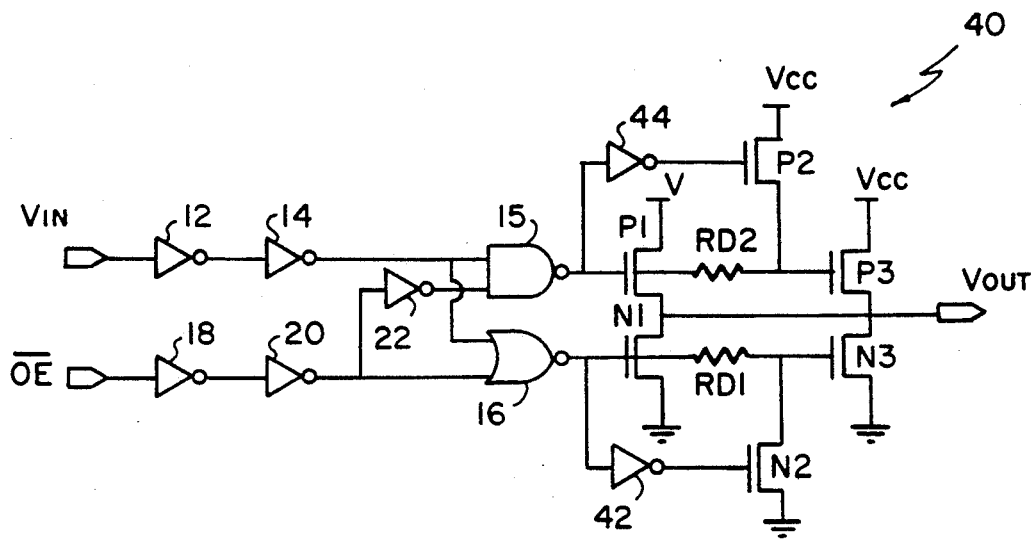
FIG. 1 is a schematic circuit diagram of a prior art output buffer circuit for reducing switching induced noise described in U.S. Pat. No. 4,961,010 and corresponding to FIG. 4 of that patent.
Figure 2:
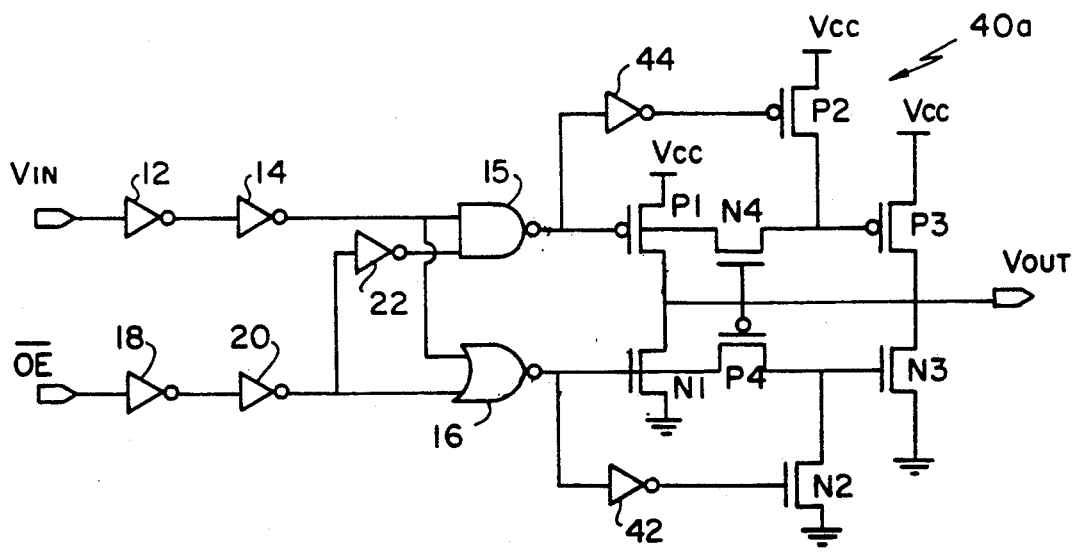
FIG. 2 is a schematic circuit diagram of an output buffer circuit with output voltage sensing for reducing switching induced noise described in U.S. Pat. application Ser. No. 483,931 and corresponding to FIG. 2 of that patent application.
Figure 3:
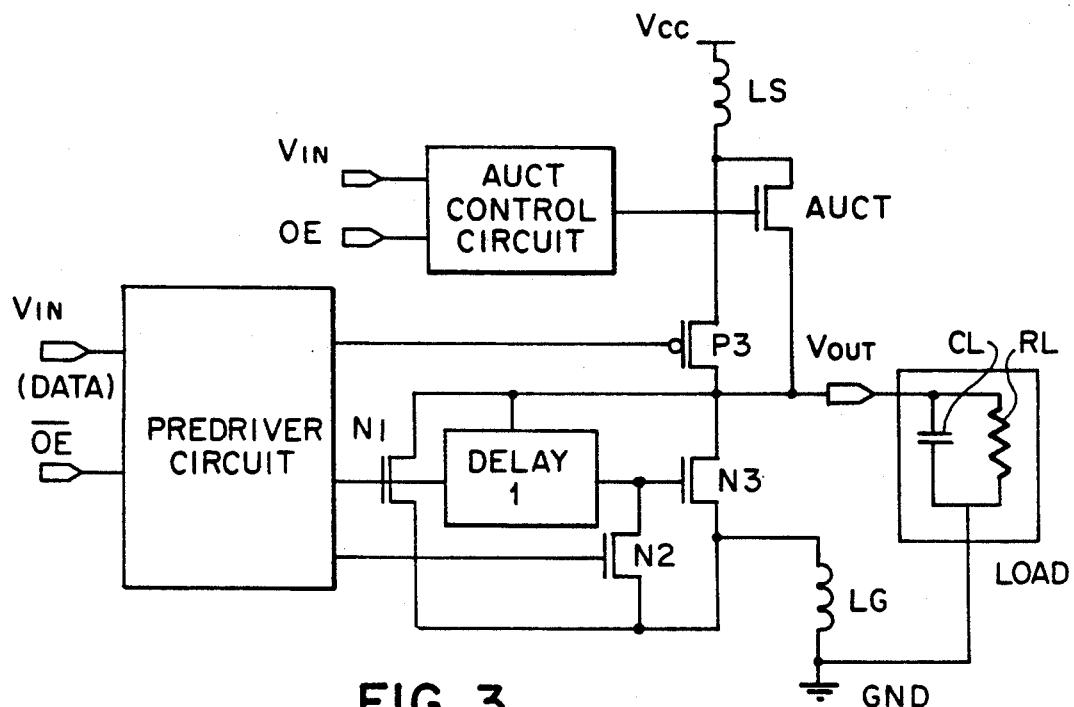
FIG. 3 is a schematic circuit diagram of an output buffer circuit with an anti-undershoot circuit described in U.S. Pat. application Ser. No. 327,348.
Figure 4:
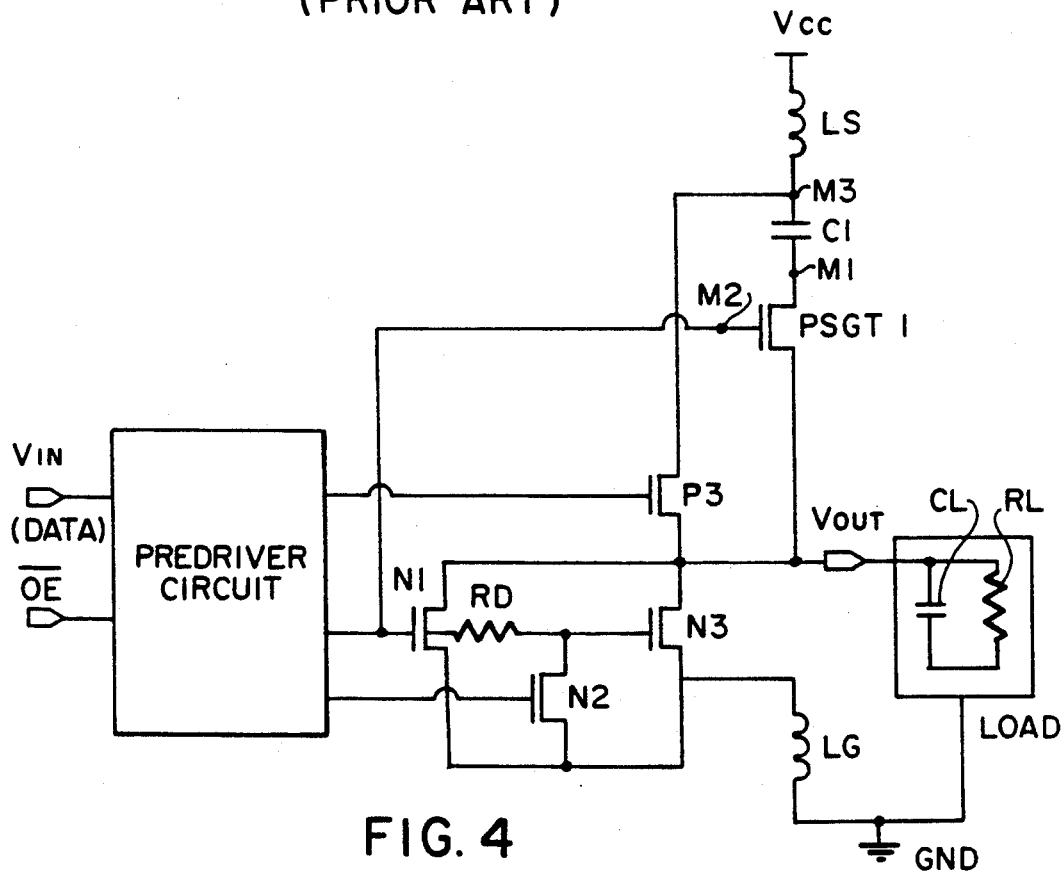
FIG. 4 is a schematic circuit diagram of an output buffer circuit with controlled charge storage according to the invention for reducing ground bounce and undershoot while maintaining switching speed.

A simplified output buffer circuit with controlled charge storage according to the invention is illustrated in FIG. 4. Circuit components performing the same or similar functions as circuit components in FIGS. 1–3 are indicated by the same reference designations. In addition there is provided an output discharging charge storage capacitor Cl with a first node m3 coupled to the high potential power rail $V_{CC}$ through the parasitic supply rail lead inductance LS. A first passgate circuit provided by NMOS transistor element PSGT1 is coupled with the primary current path between the second node m1 of capacitor C1 and the out $V_{OUT}$. The control gate node m2 of the passgate transistor element PSGT1 is coupled to the control node of the secondary pulldown transistor element N1 so that PSGT1 operates in phase with N1.

The second node m1 of charge storage capacitor C1 is maintained at the low potential or ground potential level prior to transition from high to low potential level at the output as hereafter described. Upon transition from high to low potential level at the output, passgate transistor element PSGT1 turns on in phase with the secondary pulldown transistor element N1 for transient storage of discharge from the output load capacitance CL. This diversion of charge away from the ground rail reduces ground bounce caused by acceleration of charge through the parasitic ground lead inductance LG while maintaining high switching speed. As the output $V_{OUT}$ falls to ground potential level, the charge stored in capacitor C1 is discharged for transient sourcing of counteracting current to dissipate ground undershoot energy stored in the parasitic ground lead inductance LG of the low potential power rail.

Figure 5:
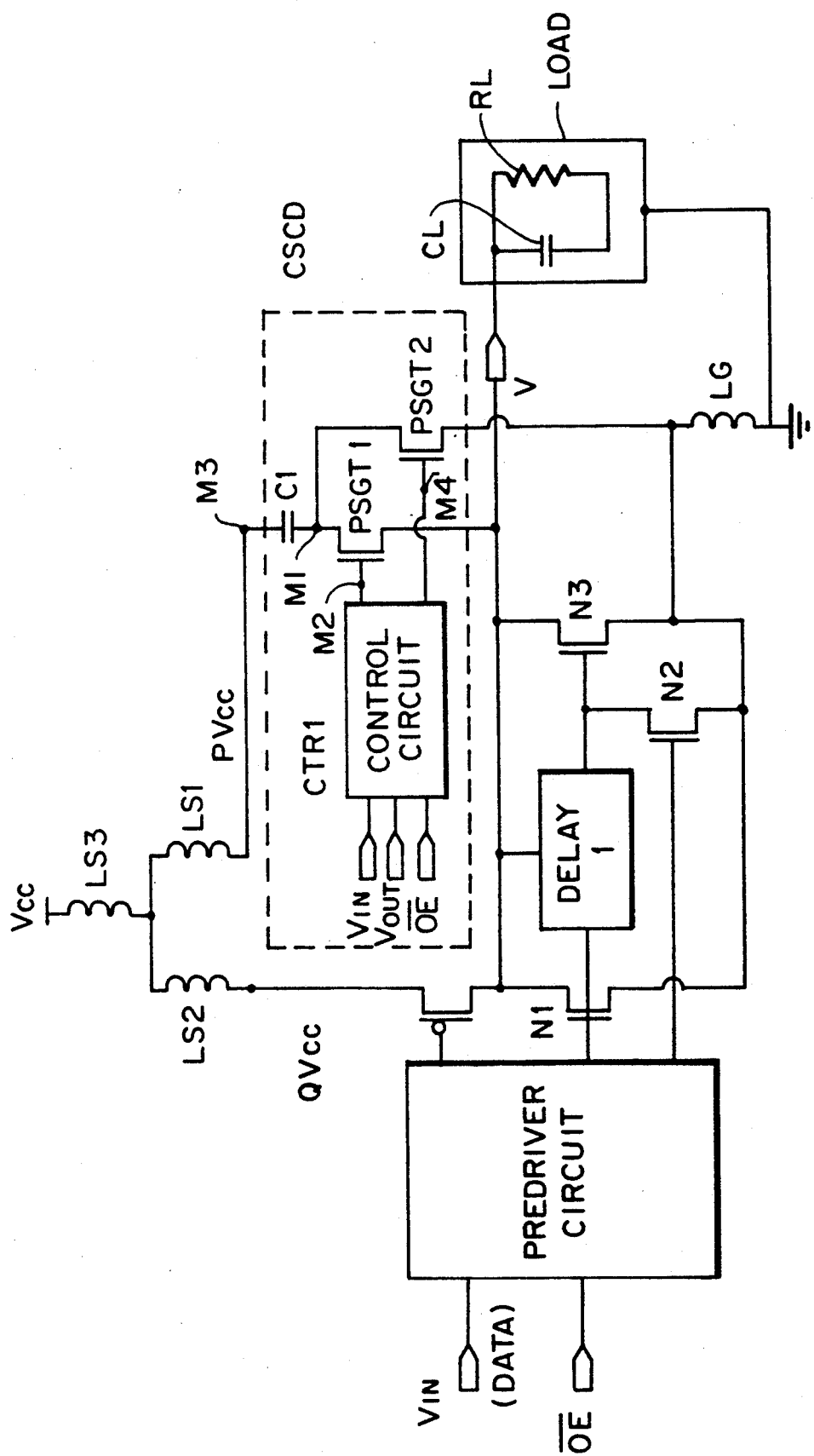
FIG. 5 is a schematic circuit diagram of a preferred embodiment of the output buffer circuit with controlled charge storage including the charge storage and discharge circuit with control circuit for reducing ground rail noise, and maintaining high speed switching.

A preferred full implementation of the output buffer circuit with controlled charge storage is illustrated in FIG. 5. A first control circuit CTR1 is coupled to the control node m2 of the first passgate transistor element PSGT1. As hereafter more fully described the first control circuit CTR1 is coupled to the data signal input $V_{IN}$ and output $V_{OUT}$ for controlling the conducting state of PSGT1 according to the data signals at the input and output. The first control circuit CTR1 is constructed for transient turn on of the first passgate circuit PSGT1 when the output $V_{OUT}$ is still at high potential level during transition from high to low potential level at the output. For tristate output buffer circuits, a tristate enable input $\overline{OE}$ is also coupled to CTR1.

A second passgate circuit provided by NMOS transistor element PSGT2 is coupled between the second node m1 of the charge storage capacitor C1 and the low potential power rail GND. The control gate node m4 of PSGT2 is coupled to the first control circuit CTR1 for controlling the conducting state of the second passgate circuit PSGT2 according to the data signal at the output.

An advantage of the circuit arrangement of FIG. 5 is that the passgate transistor elements PSGT1 and PSGT2 provide separate control paths for charging and discharging the charge storage capacitor. During a first phase of the transition from high to low potential level at the output NMOS transistor PSGT1 becomes conducting during the transient period while the output is still at high potential level. Capacitor C1 thereby facilitates discharge of the output load capacitance CL by transient storage of charge. During the second phase following substantial transition to the low potential level at the output, a brief time delay after the first phase, NMOS transistor element PSGT2 becomes conducting releasing the stored charge in capacitor C1. The discharge from capacitor C1 provides a transient sourcing of sacrificial or counteracting current for dissipating ground undershoot energy stored in the parasitic lead inductance LG of the ground rail.

The capacitance value of charge storage capacitor C1 is selected with reference to the value of the output load capacitance CL. For a standard output load capacitance CL of, for example, 50 pf, C1 is preferably selected to be in the range of CL/2 to CL or 25–50 pf. Passgate transistor elements PSGT1 and PSGT2 are selected for channel widths of, for example, 300μ and 100μ respectively for an output buffer circuit containing primary output transistor elements with channel widths in the range of 800μ–1400μ and secondary output transistor elements in the range of 200μ.

Figure 6:
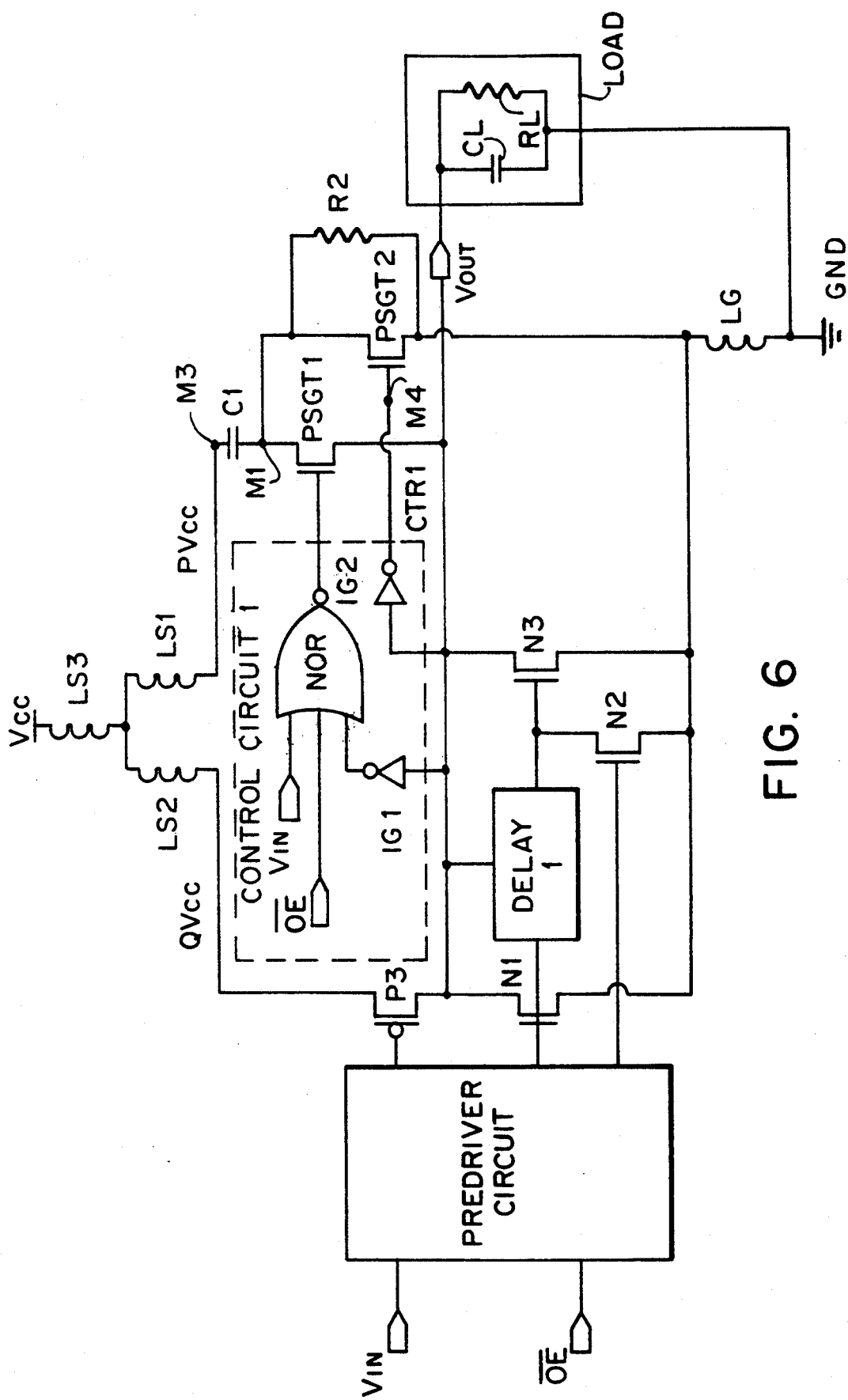
FIG. 6 is a schematic circuit diagram of the output buffer circuit with controlled charge storage showing the details of an example control circuit.

A detail of the control circuit CTR1 is illustrated in FIG. 6. The control circuit CTR1 incorporates a NOR gate having a first input coupled to the data signal input $V_{IN}$ and a second input coupled to the output $V_{OUT}$ through a first inverter gate IG1. A third input is provided for tristate output buffer circuits for the tristate enable input signal $\overline{OE}$. A second inverter gate IG2 couples the signal at the output $V_{OUT}$ to the control node m4 of the second passgate transistor element PSGT2. The control circuit configuration of FIG. 6 implements the charge storage and discharge circuit functions described with reference to FIG. 5 and illustrated graphically in FIG. 6A.

Figure 6A:
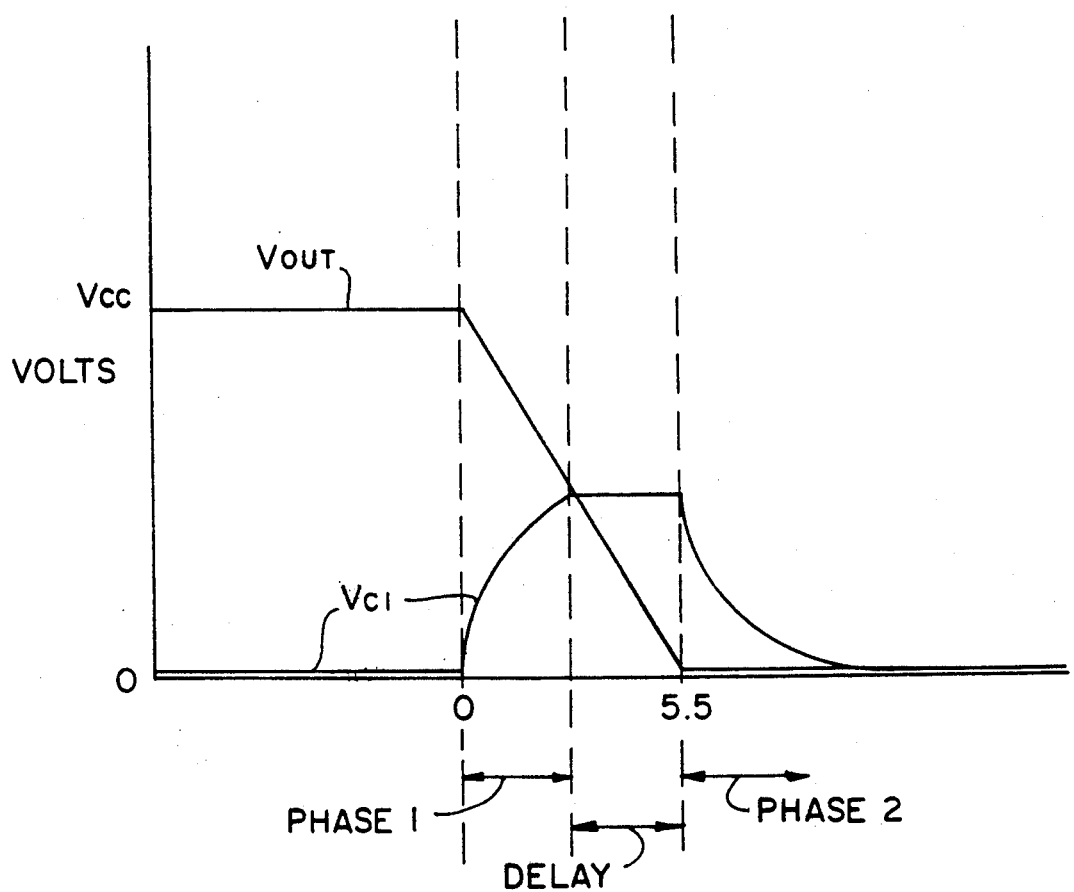
FIG. 6A is a graph of the charge storage and discharge voltage levels of the output discharging storage capacitor during transition from high to low potential at the output for the circuit of FIG. 6.

As illustrated in the graph of FIG. 6A, output discharging charge storage capacitor C1 receives charge during phase 1 of the high to low potential level transition at the output when passgate transistor element PSGT1 is conducting. At the midpoint of the transition from high to low potential level at the output $V_{OUT}$, passgate circuit PSGT1 turns off and both passgate transistor elements PSGT1, PSGT2 are off for a brief delay. During phase 2 upon completion of the logic high to low potential level at the output, the second passgate transistor element PSGT2 turns on and capacitor C1 discharges the stored charge sourcing a transient ground undershoot counteracting current. The second node m1 of capacitor C1 returns to ground potential level where it remains for the next transition. A high resistance leakage resistor R2, with a resistance value of for example 1 K ohms may be coupled in parallel with the passgate transistor element PSGT2 as shown in FIG. 6 to assure that the second node m1 of capacitor C1 remains at ground potential level. The two phase operation for the high to low potential level transition at the output is summarized in TABLE I.

TABLE I

| Phase | PSGT1 | PSGT2 |
|---|---|---|
| $V_{IN}/V_{OUT}$ Hi | Off | Off |
| Pase 1 | On | Off |
| Delay | Off | Off |
| Phase 2 | Off | On |
| $V_{IN}/V_{OUT}$ Lo | Off | On |

Figure 7:
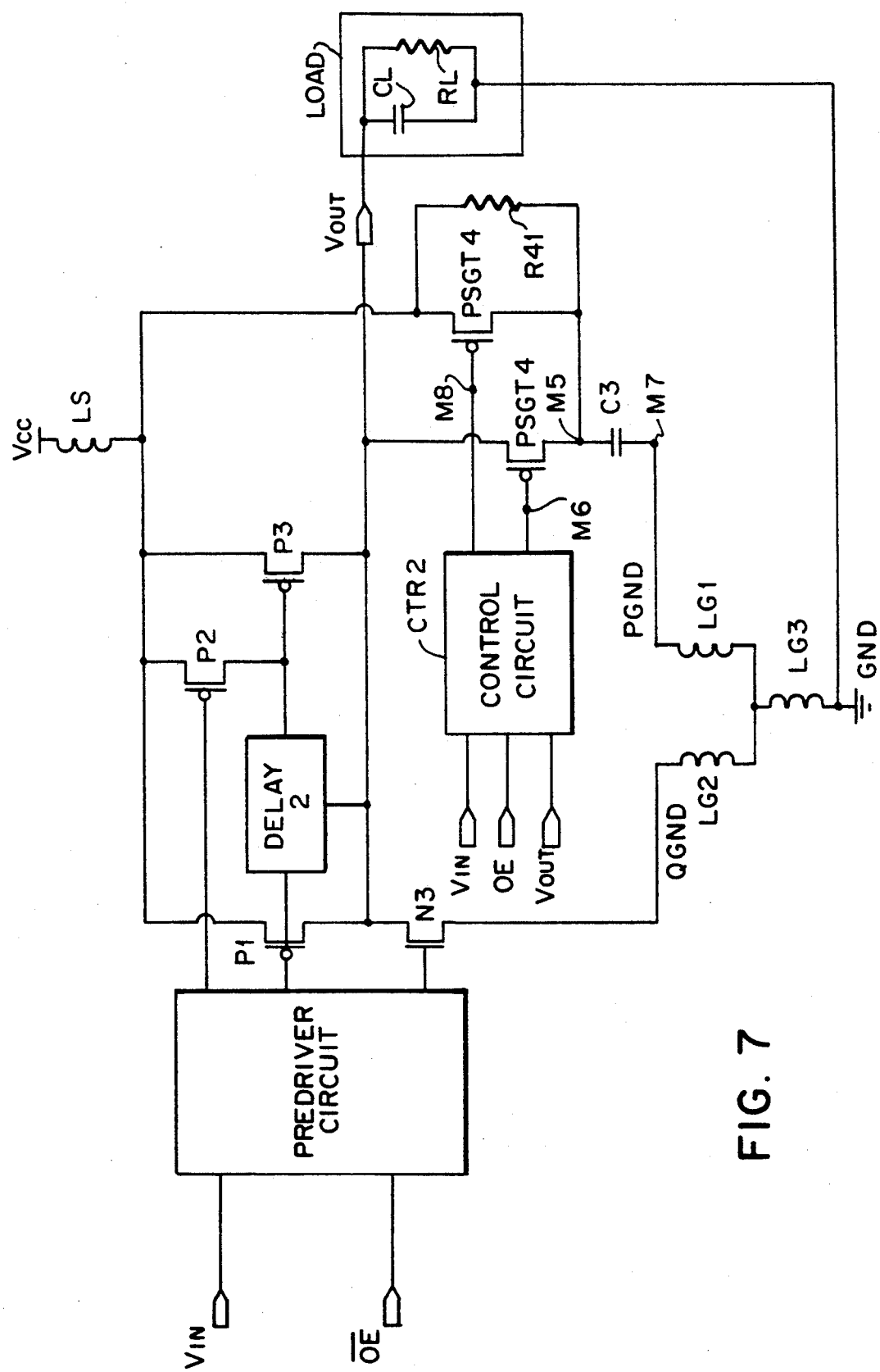
FIG. 7 is a schematic circuit diagram of a preferred embodiment of the output buffer circuit with controlled charge storage for reducing $V_{CC}$ droop and overshoot on the supply side of the output buffer circuit while maintaining switching speed.

A further feature of the circuit of FIG. 6 is the split lead rail provided on the supply side of the output buffer circuit. The split lead supply rail incorporates a common lead with common lead inductance LS3 coupled to the external power supply $V_{CC}$. Split leads with separate split lead inductances LS1 and LS2 are coupled to the output elements and internal elements respectively of the output buffer circuit. The split lead inductances LS1 and LS2 effectively isolate the noisy output supply rail lead $PV_{CC}$ on the output side of the output buffer circuit from the quiet supply rail lead $QV_{CC}$ on the internal side of the output buffer circuit. Without the isolating split leads, the output discharging charge storage capacitor C1 would otherwise couple output noise into the supply rail and to internal circuit elements. As an alternative to the split lead frames, separate and independent power supplies and power rails may also be provided. Further description of the operation of split lead leadframes is set forth in the Alan C. Rogers U.S. Pat. No. 5,049,763 referred to above. An output buffer circuit with controlled charge storage for reducing $V_{CC}$ droop and overshoot on the supply rail side of the output buffer circuit is illustrated in FIG. 7. The circuit elements are in effect a mirror image of the circuit elements of FIG. 5. An output charging storage capacitor C3 is provided with a third node m7 coupled to the low potential power rail GND. In this example a split lead ground rail is incorporated in the circuit to isolate output ground noise that might otherwise be coupled to internal circuit elements by capacitor C3. The third node m7 of output charging storage capacitor C3 is therefore coupled to the noisy ground rail lead PGND isolated from the quiet ground rail lead QGND by the split lead inductances LG1 and LG2. The split lead inductances are coupled through the common lead inductance LG3 to external ground GND.

A third passgate circuit provided by PMOS transistor element PSGT3 is coupled between the fourth node m5 of capacitor C3 and the output $V_{OUT}$. A second control circuit CTR2 is coupled to the control gate node m6 of PSGT3. The second control circuit is coupled to the data signal input $V_{IN}$ and output $V_{OUT}$ as hereafter described for controlling the conducting state of the third passgate transistor element PSGT3 according to the data signals at the input and output. As further described the second control circuit CTR2 is constructed for transient turn on of PSGT3 when the output $V_{OUT}$ is still at low potential level during transition from low to high potential level at the output.

A fourth passgate circuit PSGT4 is coupled between the fourth node m5 of capacitor C3 and the high potential power rail $V_{CC}$ through the high potential rail lead inductance LS. The control gate node of fourth passgate transistor element PSGT4 is coupled to the second control circuit CTR2 for controlling the conducting state of PSGT4 according to the data signal at the output. As hereafter described the second control circuit CTR2 is constructed for turn on of PSGT4 when the output is at the high potential level following transition from low to high potential level at the output.

Figure 8:
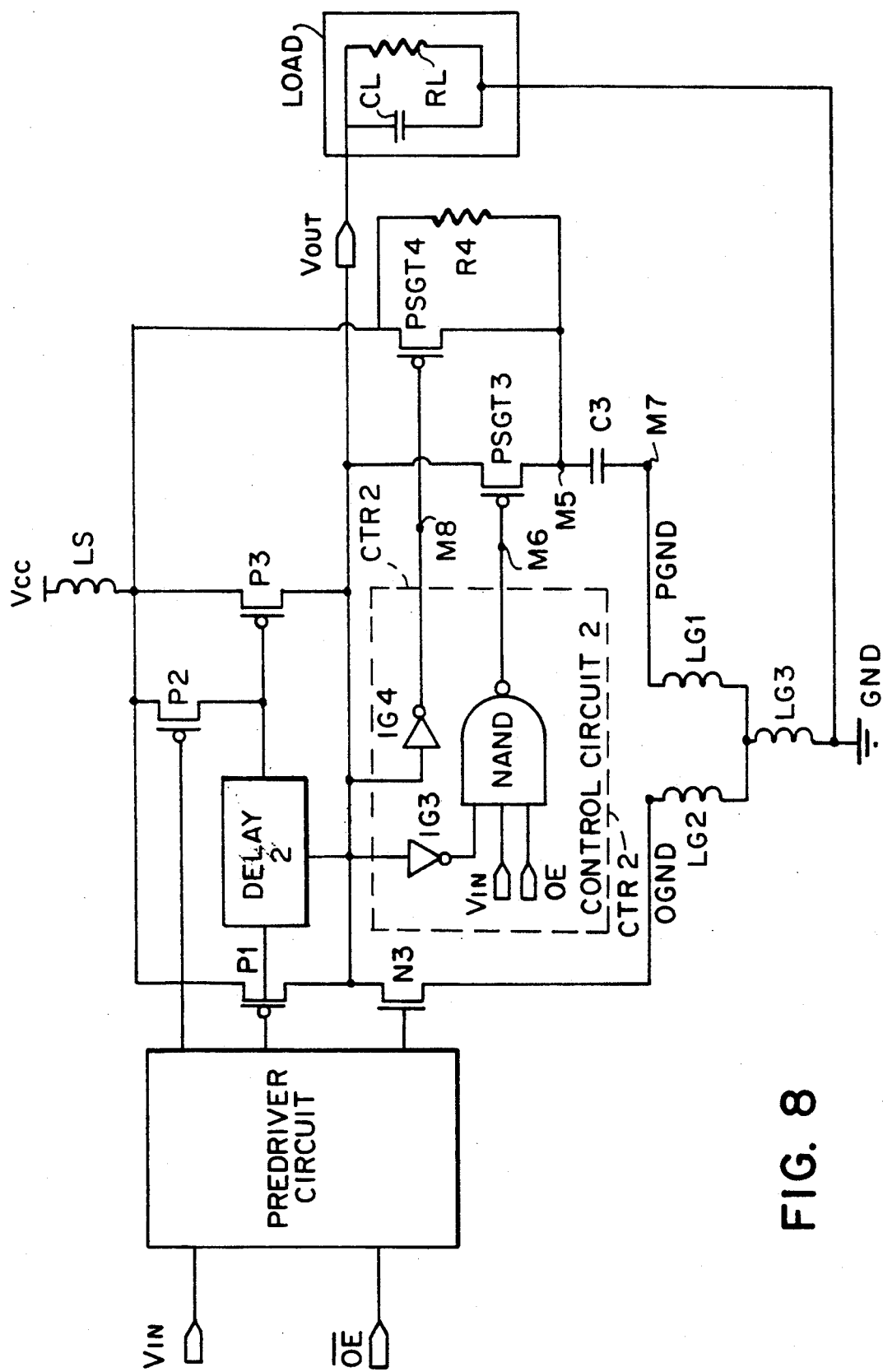
FIG. 8 is a schematic circuit diagram of the output buffer circuit of FIG. 7 showing details of an example control circuit for controlled charge release and charge storage at the output charging storage capacitor.

An example of the second control circuit CTR2 is illustrated in FIG. 8. Control circuit CTR2 incorporates a NAND gate having a first input coupled to the data signal input $V_{IN}$ and a second input coupled to the buffer circuit output $V_{OUT}$ through a third inverter gate IG3. The output of the NAND gate is coupled to the control gate node m6 of the third passgate transistor element PSGT3. The second control circuit CTR2 also includes a fourth inverter gate IG4 coupled between the output $V_{OUT}$ and the control gate node m8 of the fourth passgate transistor element PSGT4. The tristate signal is applied at the output enable OE terminal input of the NAND gate.

Figure 8A:
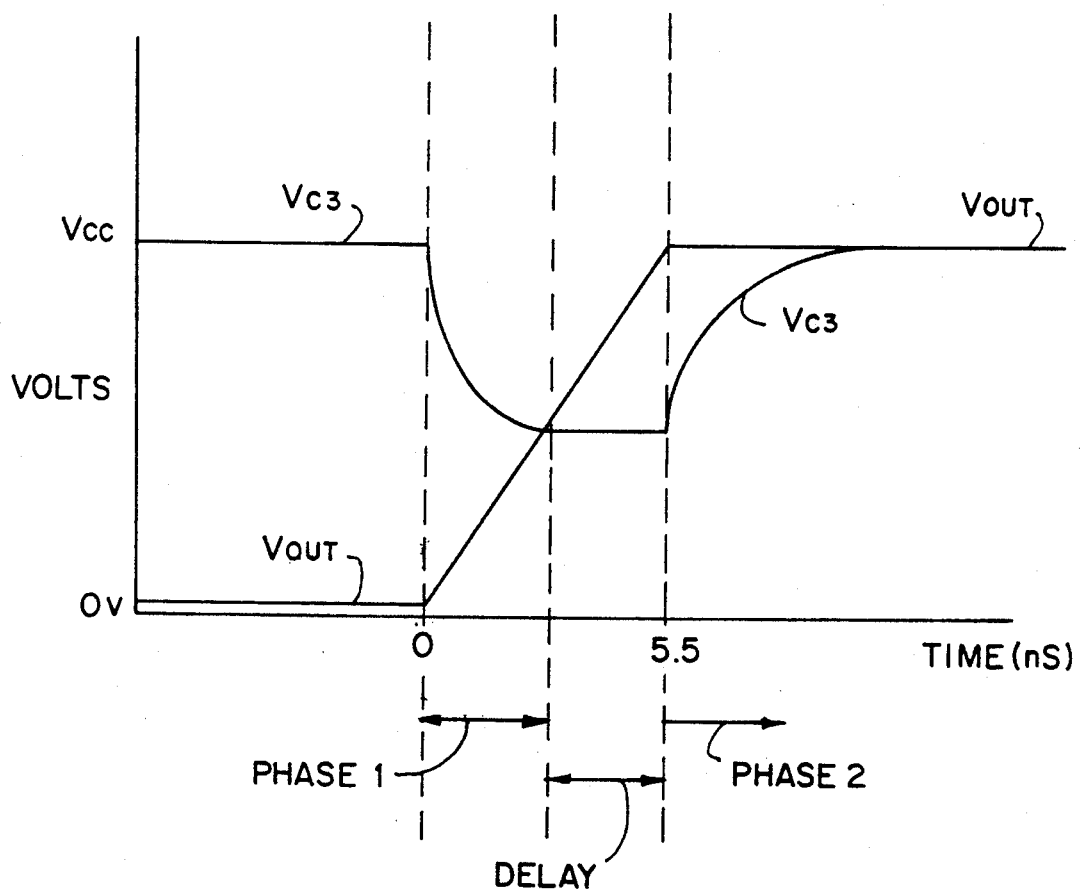
FIG. 8A is a graph showing the charge storage and discharge voltage characteristics of the output charging storage capacitor during transition from low to high potential level at the output.

The control circuit configuration of FIG. 8 provides the charge storage and discharge circuit functions described with reference to FIG. 7 and illustrated in the graph of FIG. 8A. The second node m5 of charge storage capacitor C3 is maintained at the voltage level $V_{CC}$ of the high potential power rail prior to transition from low to high potential level at the output $V_{OUT}$. A high resistance leakage resistor R4 may be coupled in parallel with PSGT4 for trickle charging and maintaining the high potential level charge at the second node m5 of capacitor C3.

In the first phase of the low to high potential level transition at the output $V_{OUT}$ the output charging storage capacitor C3 discharges into the output load capacitance CL during phase 1 while the third passgate transistor element PSGT3 is conducting. At the midpoint of the transition from low to high potential level, PSGT3 turns off and both of the passgate transistor elements PSGT3, PSGT4 are off during a brief delay. Upon transition to the high potential level at the output, fourth passgate PSGT4 turns on and capacitor C3 recharges, counteracting and dissipating supply overshoot energy during phase 2 while the passgate transistor element PSGT4 is conducting. The two phase operation of the transition from low to high potential level at the output on the supply rail side is summarized in TABLE II.

TABLE II

| Phase | PSGT3 | PSGT4 |
| --- | --- | --- |
| $V_{IN}/V_{OUT}$ Lo | Off | Off |
| Phase 1 | On | Off |
| Delay | Off | Off |
| Phase 2 | Off | On |
| $V_{IN}/V_{OUT}$ Hi | Off | On |

The output discharging charge storage capacitor C1 and the output charging storage capacitor C3 are typically integrated circuit PN junction capacitors, or isolated polysilicon to P well capacitors, or a combination of both. Alternatively, capacitors C1 and C3 can be external capacitors on the leadframe rather than on the chip. According to the latter embodiment, a single capacitor for C1 or C3 can provide transient charge storage or transient charging for several output buffer circuits on a chip.

While the invention has been described with reference to preferred example embodiments it is intended to cover all modifications and equivalents within the scope of the following claims.

I claim:

1. A method of reducing power rail noise in an edge rate controlled output buffer circuit having an output ($V_{OUT}$) for delivering low and high potential level output signals by sinking current from the output ($V_{OUT}$) to a low potential power rail (GND) and by sourcing current to the output ($V_{OUT}$) from a high potential power rail ($V_{CC}$) for respectively discharging and charging load capacitance (CL) coupled to the output ($V_{OUT}$) comprising:

transiently storing a fraction of the charge from the discharging output load capacitance (CL) in a separate charge storage first capacitor (C1) during a transition from high to low potential levels at the output ($V_{OUT}$) for reducing ground bounce.

2. The method of claim 1 comprising discharging the transiently stored charge from the separate charge storage first capacitor (C1) to the low potential power rail (GND) upon transition to a low potential level at the output ($V_{OUT}$) for counteracting ground undershoot.

3. The method of claim 2 comprising:

switching on a first electrical path (PSGT1) between the output ($V_{OUT}$) and said first capacitor C1 during the high to low potential level transition at the output ($V_{OUT}$) for transiently storing said fraction of the charge from the discharging output load capacitance (CL) and then switching off the first electrical path (PSGT1);

and switching on a second electrical path (PSGT2) between the first capacitor (C1) and the low potential power rail (BND) upon transition to a low potential level at the output ($V_{OUT}$) for discharging the transiently stored charge.

4. The method of claim 1 comprising the further steps:

transiently charging the output load capacitance (CL) with a fraction of the charge for charging the output load capacitance from a separate charge storage second capacitor (C3) during a transition from low to high potential level at the output ($V_{OUT}$) for reducing $V_{CC}$ droop;

and charging the separate charge storage second capacitor (C3) from the high potential power rail ($V_{CC}$) upon transition to a high potential level at the output ($V_{OUT}$) for counteracting $V_{CC}$ overshoot.

5. The method of claim 4 comprising:

switching on a third electrical path (PSGT3) between the output ($V_{OUT}$) and said second capacitor (C3) during the low to high potential level transition at the output for transiently charging said output load capacitance (CL) with a fraction of the required charge and then switching off the third electrical path (PSGT3);

and switching on a fourth electrical path (PSGT4) between the second capacitor (C3) and the high potential power rail ($V_{CC}$) upon reaching a high potential level at the output ($V_{OUT}$) for charging the second capacitor (C3).

6. An improved edge rate controlled output buffer circuit having an output ($V_{OUT}$) for delivering low and high potential level output signals, and a pulldown transistor circuit (N1, N3) for controlled sinking of current from the output ($V_{OUT}$) to a low potential power rail (BND) for discharging output load capacitance (CL) coupled to the output ($V_{OUT}$) comprising:

a separate output discharging charge storage first capacitor (C1) coupled between the output ($V_{OUT}$) and a first constant voltage source;

and first switch element (PSGT1) coupling the first capacitor (C1) to the output ($V_{OUT}$), and a control circuit coupled to said first switch element (PSGT1) said control circuit being constructed for switching on an electrical path to the output ($V_{OUT}$) during a transition from high to low potential level at the output ($V_{OUT}$) for transient storage of a fraction of the charge from the discharging output load capacitance (CL) in the charge storage first capacitor (C1) for reducing ground bounce.

7. The output buffer circuit of claim 6 comprising second switch element (PSGT2) coupling said charge storage first capacitor (C1) to the low potential power rail (BND), and a first control circuit (CTR1) coupled to the first and second switch elements (PSGT1, PSGT2), said first control circuit (CTR1) being constructed to turn on the first switch element (PSGT1) during transition from high to low potential level at the output ($V_{OUT}$) and then turn off the first switch element, and to turn on the second switch element (PSGT2) upon transition to a low potential level at the output ($V_{OUT}$) for discharging said transiently stored charge to the low potential power rail (GND) for counteracting ground undershoot.

8. The output buffer circuit of claim 7 wherein the output buffer circuit includes a pullup transistor circuit (P1, P3) for controlled sourcing of current to the output ($V_{OUT}$) from a high potential power rail ($V_{CC}$) for charging output load capacitance (CL) coupled to the output, and further comprising:

a separate output charging second capacitor (C3) coupled between the output and a second constant voltage source;

and third switch element (PSGT3) coupling the second capacitor (C3) to the output ($V_{OUT}$), and a second control circuit (CTR2) coupled to said third switch element (PSGT3) said second control circuit being constructed for switching on an electrical path to the output for transient charging of the output load capacitance (CL) with a fraction of the charge for charging the output load capacitance from the second capacitor (C3) for reducing $V_{CC}$ droop.

9. The output buffer circuit of claim 8 comprising fourth switch element (PSGT4) coupling said output charging second capacitor (C3) to the high potential power rail ($V_{CC}$), said second control circuit (CTR2) being coupled to the third and fourth switch elements (PSGT3, PSGT4), said second control circuit (CTR2) being constructed to turn on the third switch element (PSGT3) during transition from low to high potential at the output ($V_{OUT}$) and then turn off of the third switch element, and to turn on the fourth switch element (PSGT4) upon transition to a high potential level at the output ($V_{OUT}$) for charging the second capacitor (C3) and counteracting $V_{CC}$) overshoot.

10. The output buffer circuit of claim 9 wherein said charge storage first capacitor (C1) is coupled between the output ($V_{OUT}$) and the high potential power rail ($V_{CC}$), and the output charging second capacitor (C3) is coupled between the output ($V_{OUT}$) and the low potential power rail (GND).

11. An output buffer circuit having a data signal input ($V_{IN}$) for receiving data signals of logic high and low potential levels and an output ($V_{OUT}$) for delivering data signals propagated through the output buffer circuit, a primary pulldown transistor element (N3) coupled at the output ($V_{OUT}$) for sinking a relatively large discharge current from the output to a low potential power rail (GND), a primary pullup transistor element (P3) coupled at the output ($V_{OUT}$) for sourcing a relatively large charging current to the output from a high potential power rail ($V_{CC}$), at least one secondary pulldown transistor element (N1) coupled in parallel with the primary pulldown transistor element (N3) between the output ($V_{OUT}$) and the low potential power rail (GND), and first delay means (DELAY1) coupled between control nodes of the secondary and primary pulldown transistor elements, said secondary pulldown transistor element (N1) being coupled in the output buffer circuit to initiate a relatively small discharge current from the output ($V_{OUT}$) before the primary pulldown transistor element (N3) sinks a relatively large discharge current during transition from high to low potential level at the output, the improvement comprising:

an output discharging charge storage capacitor (C1) having first and second nodes (m3,m1) with a first node (m3) coupled to the high potential power rail ($V_{CC}$);

and a first passgate circuit (PSGT1) coupled between the second node (m1) of said output discharging charge storage capacitor (C1) and the output ($V_{OUT}$), said first passgate circuit (PSGT1) having a control node (m2), and a control circuit coupled to said control node (m2), said control circuit being constructed for turn on of the passgate circuit (PSGT1) during transition from high to low potential level at the output ($V_{OUT}$) for transient storage of a fraction of the discharge current from the output in said capacitor (C1) to reduce ground bounce while maintaining high switching speed and for transient sourcing of sacrificial current form said capacitor (C1) for counteracting ground undershoot at the low potential power rail (GND).

12. The output buffer circuit of claim 11 wherein said control circuit comprises the control node (m2) of the passgate circuit (PSGT1) coupled to a control node of the secondary pulldown transistor element (N1).

13. The output buffer circuit of claim 11 comprising a first control circuit (CTR1) coupled to the control node (m2) of the first passgate circuit (PSGT1), said first control circuit (CTR1) being coupled to the data signal input ($V_{IN}$) and output ($V_{OUT}$) of the output buffer circuit for controlling the conducting state of the first passgate circuit (PSGT1) according to the data signals at the input ($V_{IN}$) and output ($V_{OUT}$).

14. The output buffer circuit of claim 13 wherein the first control circuit (CTR1) is constructed for transient turn on of the first passgate circuit (PSGT1) when the output ($V_{OUT}$) is still at high potential level during transition from high to low potential level at the output.

15. The output buffer circuit of claim 14 comprising a second passgate circuit (PSGT2) coupled between the second node (m1) of the output discharging charge storage capacitor (C1) and the low potential power rail (GND), said second passgate circuit (PSGT2) having a control node (m4) coupled to the first control circuit (CTR1) for controlling the conducting state of the second passgate circuit (PSGT2) according to the data signal at the output ($V_{OUT}$).

16. The output buffer circuit of claim 15 wherein the first control circuit (CTR1) is constructed for turn on of the second passgate circuit (PSGT2) when the output ($V_{OUT}$) is at the low potential level following transition from high to low potential level at the output.

17. The output buffer circuit of claim 16 wherein the first control circuit (CTR1) comprises a NOR gate having a first input coupled to the output buffer circuit data signal input ($V_{IN}$), a second input coupled to the output buffer circuit output ($V_{OUT}$) through a first inverter gate (IG1), and a NOR gate output coupled to the control node (M2) of the first passgate circuit (PSGT1).

18. The output buffer circuit of claim 17 wherein the first control circuit (CTR1) further comprises a second inverter gate (IG2) coupled between the output buffer circuit output ($V_{OUT}$) and a control node (m4) of the second passgate circuit (PSGT2).

19. The output buffer circuit of claim 11 wherein the output buffer circuit comprises at least one secondary pullup transistor element (p1) coupled in parallel with the primary pullup transistor element (P3) between the high potential power rail ($V_{CC}$) and output ($V_{OUT}$), and second delay means (DELAY2) coupled between control nodes of the secondary and primary pullup transistor elements (P1,P3), said secondary pullup transistor element (P1) being coupled in the output buffer circuit to initiate a relatively small sourcing current form the high potential power rail ($V_{CC}$) to the output before the primary pullup transistor element (P3) sources a relatively large charging current during transition from low to high potential level at the output ($V_{OUT}$), the further improvement comprising:

an output charging storage capacitor (C3) having third and fourth nodes (m7,m5) with a third node (m7) coupled to the low potential power rail (GND);

and a third passgate circuit (PSGT3) coupled between the fourth node (m5) of said output charging storage capacitor (C3) and the output ($V_{OUT}$), said third passgate circuit (PSGT3) having a control node (m6) and a second control circuit coupled to said control node (m6), said second control circuit being constructed for turn on of the third passgate circuit (PSGT3) during transition from low to high potential level at the output ($V_{OUT}$) for transient sourcing of charging current form said output charging storage capacitor (C3) to the output to reduce $V_{CC}$ droop while maintaining high switching speed and for transient storage of charge for counteracting $V_{CC}$ overshoot in the high potential power rail ($V_{CC}$).

20. An output buffer circuit having a data signal input ($V_{IN}$) for receiving data signals of logic high and low potential levels and an output $V_{OUT}$ for delivering data signals propagated through the output buffer circuit, a primary pulldown transistor element (N3) coupled at the output ($V_{OUT}$) for sinking a relatively large discharge current from the output to a low potential power rail (GND), a primary pullup transistor element (P3) coupled at the output ($V_{OUT}$) for sourcing a relatively large charging current to the output from a high potential power rail ($V_{CC}$), at least one secondary pullup transistor element (P1) coupled in parallel with the primary pullup transistor element (P3) between the high potential power rail ($V_{CC}$) and output ($V_{OUT}$), and delay means (DELAY2) coupled between control nodes of the secondary and primary pullup transistor elements (P1, P3), said secondary pullup transistor element (P1) being coupled in the output buffer circuit to initiate a relatively small sourcing current from the high potential power rail ($V_{CC}$) to the output before the primary pullup transistor element (P3) sources a relatively large charging current during transition from low to high potential level at the output ($V_{OUT}$), the improvement comprising:

an output charging storage capacitor (C3) having third and fourth nodes (m7,m5) with a third node (m7) coupled to the low potential power rail (GND);

and a third passgate circuit (PSGT3) coupled between the fourth node (m5) of said output charging storage capacitor (C3) and the output ($V_{OUT}$), said third passgate circuit (PSGT3) having a control node (m6), and a control circuit coupled to the control node (m6) being constructed for turn on of the third passgate circuit (PSGT3) during transition from low to high potential level at the output ($V_{OUT}$) for transient sourcing of charging current from said output charging storage capacitor (C3) to the output to reduce $V_{CC}$ droop while maintaining high switching speed and for transient storage of charge for counteracting $V_{CC}$ overshoot in the high potential power rail ($V_{CC}$).

21. The output buffer circuit of claim 20 wherein said control circuit comprises the control node (m6) of the third passgate circuit (PSGT3) coupled to a control node of the secondary pullup transistor element (P1).

22. The output buffer circuit of claim 20 comprising a second control circuit (CTR2) coupled to the control node (m6) of the third passgate circuit (PSGT3), said second control circuit (CTR2) being coupled to the data signal input ($V_{IN}$) and output ($V_{OUT}$) of the output buffer circuit for controlling the conducting state of the third passgate circuit (PSGT3) according to the data signals at the input ($V_{IN}$) and output ($V_{OUT}$).

23. The output buffer circuit of claim 22 wherein the second control circuit (CTR2) is constructed for transient turn on of the third passgate circuit (PSGT3) when the output ($V_{OUT}$) is still at low potential level during transition from low to high potential level at the output.

24. The output buffer circuit of claim 23 comprising a fourth passgate circuit (PSGT4) coupled between the fourth node (m5) of the output charging charge storage capacitor (C3) and the high potential power rail ($V_{CC}$), said fourth passgate circuit (PSGT4) having a control node (m8) coupled to the second control circuit (CTR2) for controlling the conducting state of the fourth passgate circuit (PSGT4) according to the data signal at the output ($V_{OUT}$).

25. The output buffer circuit of claim 24 wherein the second control circuit (CTR2) is constructed for turn on of the fourth passgate circuit (PSGT4) when the output ($V_{OUT}$) is at the high potential level following transition from low to high potential level at the output.

26. The output buffer circuit of claim 25 wherein the second control circuit (CTR2) comprises a NAND gate having a first input coupled to the output buffer circuit data signal input ($V_{IN}$), a second input coupled to the output buffer circuit output ($V_{OUT}$) through a third inverter gate (IG3), a fourth inverter gate (IG4) coupled between the output buffer circuit output ($V_{OUT}$) and a control node (m8) of the fourth passgate circuit (PSGT4), and a NAND gate output coupled to the control node (m6) of the third passgate circuit (PSGT3).

* * * * *